United States Patent
Hadzidedic et al.

(10) Patent No.: US 10,533,766 B2
(45) Date of Patent: *Jan. 14, 2020

(54) HVAC CONTROLLER HAVING KEYPAD INPUT AND METHOD OF OPERATION THEREOF

(71) Applicant: Lennox Industries Inc., Richardson, TX (US)

(72) Inventors: Darko Hadzidedic, Plano, TX (US); Sakthi Narayan Kumar Murugesan, Chennai (IN)

(73) Assignee: Lennox Industries Inc., Richardson, TX (US)

( * ) Notice: Subject to any disclaimer, the term of this patent is extended or adjusted under 35 U.S.C. 154(b) by 158 days.

This patent is subject to a terminal disclaimer.

(21) Appl. No.: 15/923,208

(22) Filed: Mar. 16, 2018

(65) Prior Publication Data

US 2018/0202683 A1  Jul. 19, 2018

Related U.S. Application Data

(63) Continuation of application No. 14/692,335, filed on Apr. 21, 2015, now Pat. No. 9,933,179.

(60) Provisional application No. 62/000,353, filed on May 19, 2014.

(51) Int. Cl.
| | |
|---|---|
| H03M 11/00 | (2006.01) |
| F24F 11/62 | (2018.01) |
| G05B 15/02 | (2006.01) |
| F24F 11/46 | (2018.01) |

(52) U.S. Cl.
CPC ............ *F24F 11/62* (2018.01); *G05B 15/02* (2013.01); *H03M 11/00* (2013.01); *F24F 11/46* (2018.01)

(58) Field of Classification Search
CPC .......... F24F 11/62; F24F 11/46; G05B 15/02; H03M 11/00
USPC ....................................................... 700/276
See application file for complete search history.

(56) References Cited

U.S. PATENT DOCUMENTS

| | | | |
|---|---|---|---|
| 5,057,836 | A | 10/1991 | Inaba |
| 5,424,731 | A | 6/1995 | Kronberg |
| 5,495,616 | A | 2/1996 | Henry et al. |
| 5,512,893 | A | 4/1996 | Gulick |
| 2004/0246149 | A1 | 12/2004 | Fedigan |
| 2012/0090337 | A1 | 4/2012 | Chen et al. |

*Primary Examiner* — Kenneth M Lo
*Assistant Examiner* — Michael W Choi
(74) *Attorney, Agent, or Firm* — Winstead PC

(57) ABSTRACT

A heating, ventilation and air conditioning (HVAC) controller, a method of receiving signals from a keypad and an HVAC system incorporating the controller or the method. In one embodiment, the HVAC controller includes: (1) a keypad having at least first and second banks, (2) a reference signal source configured to generate a time-varying untransformed reference signal and provide the untransformed reference signal to the first bank, (3) transformation circuitry configured to transform the untransformed reference signal into a transformed reference signal and provide the transformed reference signal to the second bank and (4) a processor having interrupt pins coupled to corresponding keys of both the first and second banks and a further interrupt pin coupled to receive one of the untransformed and transformed reference signal.

20 Claims, 2 Drawing Sheets

HVAC CONTROLLER HAVING KEYPAD INPUT AND METHOD OF OPERATION THEREOF

CROSS-REFERENCE TO RELATED APPLICATION

This application is a continuation of U.S. patent application Ser. No. 14/692,335, filed on Apr. 21, 2015. U.S. patent application Ser. No. 14/692,335 claims the benefit of U.S. Provisional Application No. 62/000,353, filed on May 19, 2014. U.S. patent application No. 14/692,335 and U.S. Provisional Patent Application No. 62/000,353 are incorporated herein by reference.

TECHNICAL FIELD

This application is directed, in general, to heating, ventilation and air conditioning (HVAC) controllers and, more specifically, to an HVAC controller in which input signals from a keypad are received and acted upon.

BACKGROUND

A heating, ventilation and air conditioning (HVAC) system commonly employs a controller for governing the operation of at least some part of the HVAC system. For example, a rooftop unit (RTU), which is most often used to condition a commercial building, may employ a controller to activate a compressor or a furnace to cool or warm air and a blower to deliver the cool or warm air to the building beneath. A controller produces one or more output (control) signals based upon one or more input (sense) signals.

Controllers often include a keypad configured to allow a person, such as a technician or installer, to configure, diagnose or control the operation of the HVAC system. The keypad has multiple keys (or, synonymously, buttons), typically arranged in a two-dimensional array of columns and rows, that generate input signals to the controller when depressed. In a typical keypad, each key produces a unique input signal.

The keypad is merely an input device; other circuitry must be provided to receive and act on the input signals the keypad provides. In the case of an HVAC controller, the controller's processor is configured to perform this function. Two conventional alternative approaches may be used to couple a keypad to a processor. A first approach is to couple each address line representing each column and row of the keypad to a different input pin of the processor. For example, a keypad having three columns and four rows would use 3+4=7 input pins. The pressing of a key manifests as a change of state in the two address lines corresponding to the column and row in which the key lies, The processor continually scans (or, synonymously, polls) the pins to detect whether the states of any of the address lines have changed, thereby indicating the occurrence of a keystroke and identifying the particular key pressed. A second approach to couple a keypad to a processor is to couple a line corresponding to each key to a different input pin of the processor. For example, a keypad having three columns and four rows would use 3×4=12 input pins. As with the first approach, the processor continually scans the pins to detect whether the state of any of the lines has changed, thereby indicating the occurrence of a keystroke and identifying the particular key pressed.

Unfortunately, both approaches have shortcomings. The scanning required by the first approach is relatively complex, consumes significant processing resources ("bandwidth") and ultimately increases the overall cost and power consumption of the controller. The second approach requires substantially less and simpler scanning. Unfortunately, it requires more pins than the first approach, which typically increases the overall cost and complexity of the controller. Nevertheless, both approaches are commonly employed in commercially available HVAC controllers.

SUMMARY

One aspect provides an HVAC controller. In one embodiment, the HVAC controller includes: (1) a keypad having at least first and second banks, (2) a reference signal source configured to generate a time-varying untransformed reference signal and provide the untransformed reference signal to the first bank, (3) transformation circuitry configured to transform the untransformed reference signal into a transformed reference signal and provide the transformed reference signal to the second bank and (4) a processor having interrupt pins coupled to corresponding keys of both the first and second banks and a further interrupt pin coupled to receive one of the untransformed and transformed reference signal.

Another aspect provides a method of receiving signals from a keypad. In one embodiment, the method includes: (1) providing one of an untransformed and a transformed time-varying reference signal to an input pin of a processor, (2) providing the untransformed reference signal to an interrupt pin of the processor when a key in a first bank is pressed, (3) providing the transformed reference signal to the interrupt pin when a key in a second bank is pressed and (4) in response to assertion of an interrupt on the interrupt pin, comparing states of the input and interrupt pins to determine which of the key in the first bank and the key in the second bank asserted the interrupt.

Yet another aspect provides an HVAC system. In one embodiment, the HVAC system includes: (1) a compressor, (2) a furnace associated with the compressor, (3) a blower associated with the compressor and furnace and (4) a controller associated with the compressor, the furnace and the blower, the controller having: (4a) a keypad having at least first and second banks, (4b) a reference signal source configured to generate a time-varying untransformed reference signal and provide the untransformed reference signal to the first bank, (4c) transformation circuitry configured to transform the untransformed reference signal into a transformed reference signal and provide the transformed reference signal to the second bank and (4d) a processor having interrupt pins coupled to corresponding keys of both the first and second banks and a further interrupt pin coupled to receive one of the untransformed and transformed reference signal.

BRIEF DESCRIPTION

Reference is now made to the following descriptions taken in conjunction with the accompanying drawings, in which.

DETAILED DESCRIPTION

As stated above, while both approaches described in the Background above are commonly employed in commercially available HVAC controllers, they each have shortcomings that ultimately diminish the controller's performance. These shortcomings grow as the number of keys in the keypad increases. It is realized herein that an approach that requires less than one processor pin per key and reduces scanning may reduce the power consumption, complexity and cost of an HVAC controller.

It is further realized herein that multiple keys can be associated with a given processor pin, as long as some mechanism exists to tell which key is being pressed. It is further realized that a time-varying reference signal and circuitry for transforming (e.g., phase-shifting or inverting the reference signal) may be employed to provide the mechanism to tell which key is being pressed. It is yet further realized that interrupt pins can be used to reduce, and perhaps eliminate scanning to detect whether a key has been pressed. Those skilled in the pertinent art understand that interrupt pins are a special type of input pin that, when "asserted" (brought to a logic high value) interrupts the normal execution of software or firmware instructions in the processor and prompts the execution of special software or firmware instructions, often called an "interrupt handler."

Described herein are various embodiments of a controller having keypad input and a method of receiving signals from a keypad. Before describing the embodiments in detail, an example of an overall HVAC system having such controller or employing such method will be described.

Figure 1:
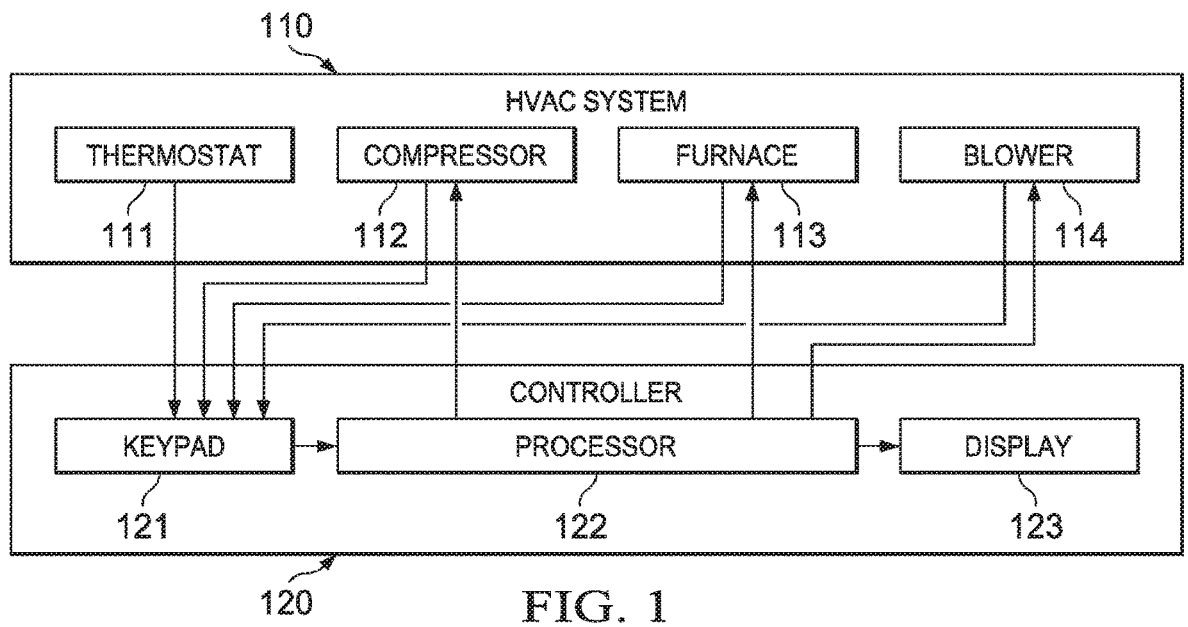
FIG. 1 is a high-level block diagram of an HVAC system and a controller therefor.

FIG. 1 is a high-level block diagram of an HVAC system 110 and a controller 120 therefor. The HVAC system 110 includes a thermostat 111, a compressor 112, a furnace 113 and a blower 114, which are associated with each other in that ones of them are coupled to and cooperate with one another. The thermostat 111 is configured to generate commands to cool, warm and/or move air through the HVAC system, typically as a function of the relationship between a sensed indoor temperature and a set point temperature. The compressor 112 is configured to compress and propel a refrigerant through a loop to transfer heat between evaporator and condenser coils (not shown) to cool air passing through the evaporator coils. The furnace 113 is configured to heat air either by gas combustion or electrical resistance. The blower 114 is configured to pull air from a conditioned space (e.g., a building interior), through the evaporator coils and/or furnace 113 and reintroduce the air back into the conditioned space.

Those skilled in the pertinent art will understand that HVAC systems may take many alternative forms. For example, some HVAC systems have dehumidifiers, while others have heat pumps that operate in conjunction with or in lieu of the compressor 112 and furnace 113. Still others have multiple compressors or multi-stage compressors. Yet others have multiple furnaces and/or multiple blowers, dampers or other equipment. Though "HVAC" implies that the HVAC system is capable of both cooling and heating air, the term is used generically to encompass systems that either cool or heat air and even those that only ventilate air by means of a blower without either cooling or heating the air. Further, the invention is not limited to a particular type, size or configuration of HVAC system.

The controller 120 includes a keypad 121, a processor 122 and a display 124. The processor 122 is configured to execute software or firmware instructions to carry out computations and logical operations that typically constitute a useful process. In the embodiment of FIG. 1, the processor 122 is configured to control the HVAC system 110 based on various input signals and one or more control algorithms. Various unreferenced arrows in FIG. 1 leading from the thermostat 111, the compressor 112, the furnace 113 and the blower 114 to the front-end circuitry 121, then to the processor 122 then back to the compressor 112, the furnace 113 and the blower 114 illustrate one embodiment of a control flow involving the HVAC system 110 and the controller 120. The processor 122 may be of any conventional or later-developed type, including: a microcontroller, a microprocessor, a digital signal processor and a programmable gate array. Other processor types may be employed in still other embodiments.

The keypad 121 is an input device having multiple depressible keys, buttons or areas of a touch-sensitive display configured to generate input signals for the processor 122. The keypad 123 may allow, for example, a service technician to program, configure, diagnose or change the operation of the HVAC system 110 or controller 120. In the illustrated embodiment, the keypad 121 has multiple, momentary-contact keys arranged in a two-dimensional array of columns and rows. The display 123 is an output device that the processor 122 can drive to display text, images or a combination of both. In the illustrated embodiment, the display 124 is a liquid crystal display. In an alternative embodiment, the display 124 is of another conventional or later-developed type.

Figure 2:
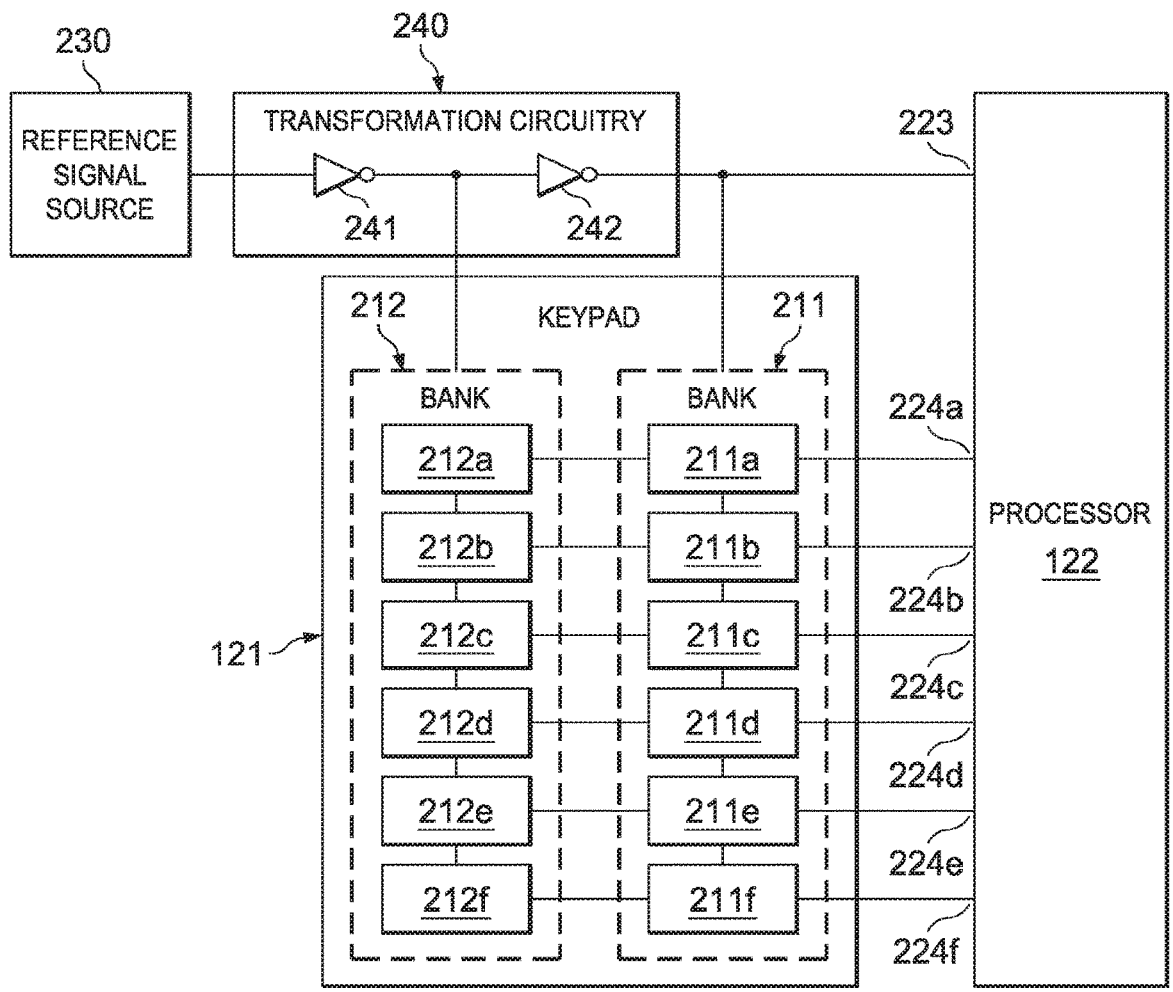
FIG. 2 is a block diagram of a portion of one embodiment of the controller of FIG. 1 showing, in particular, keypad input thereto.

FIG. 2 is a block diagram of a portion of one embodiment of the controller of FIG. 1 showing, in particular, keypad input thereto. FIG. 2 shows the keypad 121 and processor 122 of FIG. 1. The keypad 121 of FIG. 2 happens to have 12 keys. FIG. 2 shows various keys 211a, 211b, 211c, 211d, 211e, 211f, 212a, 212b, 212c, 212d, 212e, 212f arranged or divided as shown into a first bank 211 and a second bank 212. The keys 211a, 212a correspond to one another and are coupled to a first interrupt pin 224a of the processor 122. The keys 211b, 212b correspond to one another and are coupled to a second interrupt pin 224b of the processor 122. The keys 211c, 212c correspond to one another and are coupled to a third interrupt pin 224c of the processor 122. The keys 211d, 212d correspond to one another and are coupled to a fourth interrupt pin 224d of the processor 122. The keys 211e, 212e correspond to one another and are coupled to a fifth interrupt pin 224e of the processor 122. The keys 211f, 212f correspond to one another and are coupled to a sixth interrupt pin 224f of the processor 122.

A reference signal source 230 is configured to generate a time-varying untransformed reference signal. In the illustrated embodiment, the time-varying untransformed reference signal is periodic (i.e. a clock signal). In an alternative embodiment, the time-varying untransformed reference signal is aperiodic. In the illustrated embodiment, the time-varying untransformed reference signal varies between zero volts and a digital logic voltage (e.g., 5 volts or 3.3 volts) typically selected to be compatible with the operating voltage of the processor 122. In another embodiment, the time-varying untransformed reference signal varies between other extremes. In the illustrated embodiment, the time-varying untransformed reference signal is a square wave. In an alternative embodiment, the time-varying untransformed reference signal is a sine or triangular wave.

Transformation circuitry 240 is configured to transform the untransformed reference signal into a transformed reference signal. The untransformed reference signal is provided to the first bank 211, and the transformed reference signal is provided to the second bank 212. In the embodiment of FIG. 2, the untransformed reference signal is also provided to an input pin 223 of the processor 122. In the illustrated embodiment, the transformation circuitry 240 transforms the reference signal by inverting it and includes first and second inverters 241, 242 configured to invert and re-invert the untransformed reference signal to yield the transformed and untransformed reference signals. Because the reference signal of FIG. 1 is periodic, inversion is the same as a 180.degree. phase shift. Again, the untransformed reference signal (emerging from the inverter 242) is provided to the first bank 211 and the input pin 223, and the transformed reference signal (emerging from the inverter 241) is provided to the second bank 212.

The operation of the illustrated keypad input will now be described. With no keys being pressed, the processor executes instructions in a normal manner. When a key is pressed, e.g., the key 212a, the transformed reference signal is provided to the first interrupt pin 224a, which brings it to a logic high level (a digital "one"). The resulting interrupt triggers the execution of an interrupt handler. The interrupt handler is immediately able to determine that either the key 212a or 211a was pressed, because they are the only two keys coupled to the first interrupt pin 224a. However, the interrupt handler is further configured to scan the input pin 223 (which bears the untransformed reference signal) and the interrupt pin 224 (which bears the transformed reference signal). Because the untransformed and transformed reference signals differ from one another, the interrupt handler determines that the key pressed must belong to the second bank 212. Hence, the interrupt handler correctly determines that the key 212a was pressed. Were the key 211a to have been pressed instead, a scan of the input pin 223 and the first interrupt pin 224a would reveal substantially the same (i.e. untransformed) reference signal, allowing it to determine correctly that the key 211a had been pressed. The same example applies to the remaining keys 211b, 211c, 211d, 211e, 211f, 212b, 212c, 212d, 212e, 212f and interrupt pins 224b, 224c, 224d, 224e, 224f.

Figure 3:
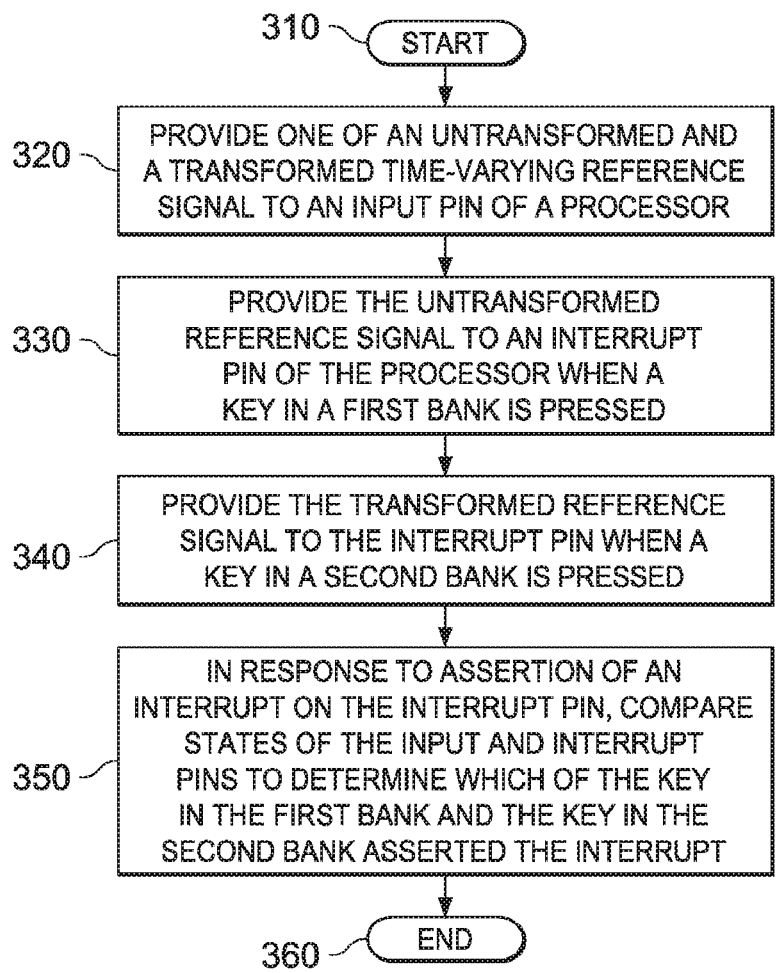
FIG. 3 is a flow diagram of one embodiment of a method of receiving signals from a keypad.

FIG. 3 is a flow diagram of one embodiment of a method of receiving signals from a keypad. The method begins in a start step 310. In a step 320, one of an untransformed and a transformed time-varying reference signal are provided to an input pin of a processor. In a step 330, the untransformed reference signal is provided to an interrupt pin of the processor when a key in a first bank is pressed. In a step 340, the transformed reference signal is provided to the interrupt pin when a key in a second bank is pressed. In a step 350 and in response to assertion of an interrupt on the interrupt pin, the states of the input and interrupt pins are compared to determine which of the key in the first bank and the key in the second bank asserted the interrupt. The method ends in an end step 360.

At least a portion of the above-described apparatuses and methods may be embodied in or performed by various conventional digital data processors, microprocessors or computing devices, wherein these devices are programmed or store executable programs of sequences of software instructions to perform one or more of the steps of the methods, e.g., steps of the method of FIG. 3. The software instructions of such programs may be encoded in machine-executable form on conventional digital data storage media that is non-transitory, e.g., magnetic or optical disks, random-access memory (RAM), magnetic hard disks, flash memories, and/or read-only memory (ROM), to enable various types of digital data processors or computing devices to perform one, multiple or all of the steps of one or more of the above-described methods, e.g., one or more of the steps of the method of FIG. 3. Additionally, an apparatus, such as an HVAC controller, may be designed to include the necessary circuitry or programming to perform each step of a method of disclosed herein.

Portions of disclosed embodiments may relate to computer storage products with a non-transitory computer-readable medium that have program code thereon for performing various computer-implemented operations that embody a part of an apparatus, system, or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

What is claimed is:

1. An HVAC controller, comprising:
   a keypad having at least a first bank and a second bank;
   a processor having interrupt pins coupled to corresponding keys of both the first bank and the second bank and a further interrupt pin coupled to an output of a transformation circuitry to receive one of an untransformed reference signal and a transformed reference signal;
   wherein the processor is configured to:
      respond to an interrupt by determining whether a signal on at least one interrupt pin of the interrupt pins differs from a signal on the further interrupt pin;
      responsive to a positive determination, identify that a key in the second bank asserted the interrupt; and
      responsive to a negative determination, identify that a key in the first bank asserted the interrupt.

2. The HVAC controller of claim 1, further comprising:
   a reference signal source configured to generate the untransformed reference signal and provide the untransformed reference signal to the first bank; and
   a transformation circuitry configured to transform the untransformed reference signal into the transformed reference signal and provide the transformed reference signal to the second bank.

3. The HVAC controller of claim 2, wherein the transformation circuitry is configured to phase-shift the untransformed reference signal to yield the transformed reference signal.

4. The HVAC controller of claim 2, wherein the transformation circuitry is configured to invert the untransformed reference signal to yield the transformed reference signal.

5. The HVAC controller of claim 1, wherein the untransformed reference signal is periodic.

6. The HVAC controller of claim 1, wherein the untransformed reference signal varies between volts and a digital logic voltage.

7. The HVAC controller of claim 1, wherein the untransformed reference signal is a square wave.

8. A method of receiving signals from a keypad, comprising:
   providing, by a transformation circuit, one of an untransformed and a transformed time-varying reference signal to an input pin of a processor;
   providing the untransformed reference signal to an interrupt pin of the processor when a key in a first bank is pressed;
   providing the transformed reference signal to the interrupt pin when a key in a second bank is pressed;
   determining whether a signal on the interrupt pin differs from a signal on the input pin;
   responsive to a positive determination, identify that a key in the second bank asserted the interrupt; and
   responsive to a negative determination, identify that a key in the first bank asserted the interrupt.

9. The method of claim 8, wherein the input pin of the processor is coupled to an output of the transformation circuit.

10. The method of claim 8 further comprising phase-shifting the untransformed reference signal to yield the transformed reference signal.

11. The method of claim 8 further comprising inverting the untransformed reference signal to yield the transformed reference signal.

12. The method of claim 8, wherein the untransformed reference signal is periodic.

13. The method of claim 8, wherein the untransformed reference signal varies between zero volts and a digital logic voltage.

14. The method of claim 8, wherein the untransformed reference signal is a square wave.

15. An HVAC system, comprising:
   a controller associated with at least one of a compressor, a furnace, and a blower, the controller comprising:
      a keypad having at least first and second banks;
      a processor having interrupt pins coupled to corresponding keys of both the first bank and the second bank and a further interrupt pin coupled to an output of a transformation circuitry to receive one of an untransformed and transformed reference signal;
   wherein the processor is further configured to:
      respond to an interrupt by determining whether a signal on at least one interrupt pin of the interrupt pins differs from a signal on the further interrupt pin;
      responsive to a positive determination, identify that a key in the second bank asserted the interrupt; and
      responsive to a negative determination, identify that a key in the first bank asserted the interrupt.

16. The HVAC system of claim 15, wherein the controller further comprises:
   a reference signal source configured to generate the untransformed reference signal and provide the untransformed reference signal to the first bank; and
   a transformation circuitry configured to transform the untransformed reference signal into the transformed reference signal and provide the transformed reference signal to the second bank.

17. The HVAC system of claim 16, wherein the transformation circuitry is configured to phase-shift the untransformed reference signal to yield the transformed reference signal.

18. The HVAC system of claim 16, wherein the transformation circuitry is configured to invert the untransformed reference signal to yield the transformed reference signal.

19. The HVAC system of claim 16, wherein the untransformed reference signal is periodic and a square wave.

20. The HVAC system of claim 16, wherein the untransformed reference signal varies between zero volts and a digital logic voltage.

* * * * *